United States Patent
Oh et al.

(10) Patent No.: US 11,551,913 B2
(45) Date of Patent: Jan. 10, 2023

(54) SUBSTRATE PROCESSING APPARATUS

(71) Applicant: JUSUNG ENGINEERING CO., LTD., Gwangju-si (KR)

(72) Inventors: Woong Kyo Oh, Jwangju-si (KR); Hyun Ho Koo, Gwangju-si (KR); Kwang Su Yoo, Gwangju-si (KR); Sang Du Lee, Gwangju-si (KR); Kyu jung Cho, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 0 days.

(21) Appl. No.: 16/965,995

(22) PCT Filed: Jan. 29, 2019

(86) PCT No.: PCT/KR2019/001196
§ 371 (c)(1),
(2) Date: Jul. 29, 2020

(87) PCT Pub. No.: WO2019/147097
PCT Pub. Date: Aug. 1, 2019

(65) Prior Publication Data
US 2020/0357613 A1    Nov. 12, 2020

(30) Foreign Application Priority Data

Jan. 29, 2018 (KR) ........................ 10-2018-0010814

(51) Int. Cl.
*H01J 37/32* (2006.01)
(52) U.S. Cl.
CPC .... *H01J 37/32568* (2013.01); *H01J 37/3244* (2013.01); *H01J 37/32715* (2013.01); *H01J 2237/327* (2013.01)

(58) Field of Classification Search
CPC .......... H01J 37/32568; H01J 37/32532; H01J 37/32715; H01J 37/32009; H01J 37/3244; H01J 37/32623; H01J 37/32541
See application file for complete search history.

(56) References Cited

U.S. PATENT DOCUMENTS

| 2003/0019580 A1* | 1/2003 | Strang ............... C23C 16/45589 |
| | | 156/345.33 |
| 2013/0206338 A1* | 8/2013 | Tanaka .............. H01J 37/32568 |
| | | 156/345.33 |

(Continued)

FOREIGN PATENT DOCUMENTS

| JP | 2010073970 A | 4/2010 |
| JP | 2010103455 A | 5/2010 |

(Continued)

*Primary Examiner* — Tung X Le
(74) *Attorney, Agent, or Firm* — Renaissance IP Law Group LLP (57) ABSTRACT

The present inventive concept relates to a substrate treatment apparatus comprising: a support part for supporting a substrate; a first electrode part disposed above the support part; a second electrode part disposed above the first electrode part; a generation hole formed to extend through the first electrode part; and a protruding electrode coupled to the second electrode part while protruding downward from the second electrode part at a position corresponding to the generation hole, wherein the protruding electrode is formed to have a shorter length than the first electrode part in the vertical direction.

6 Claims, 9 Drawing Sheets

(56) References Cited

U.S. PATENT DOCUMENTS

2015/0270119 A1* 9/2015 Yahata ................ H01J 37/3244
438/758
2017/0345617 A1* 11/2017 Takeda .............. H01J 37/32357
2018/0114690 A1* 4/2018 Nishikawa .......... H01L 21/0206

FOREIGN PATENT DOCUMENTS

| JP | 2015015382 A | 1/2015 |
| KR | 20120062698 A | 6/2012 |

* cited by examiner

SUBSTRATE PROCESSING APPARATUS

TECHNICAL FIELD

The present disclosure relates to a substrate processing apparatus which performs a processing process such as a deposition process and an etching process on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed, and examples of the processing process include a deposition process of depositing a thin film including a specific material on a substrate, a photo process of selectively exposing a portion of a thin film by using a photosensitive material, an etching process of removing the selectively exposed portion of the thin film to form a pattern, etc.

Figure 1:
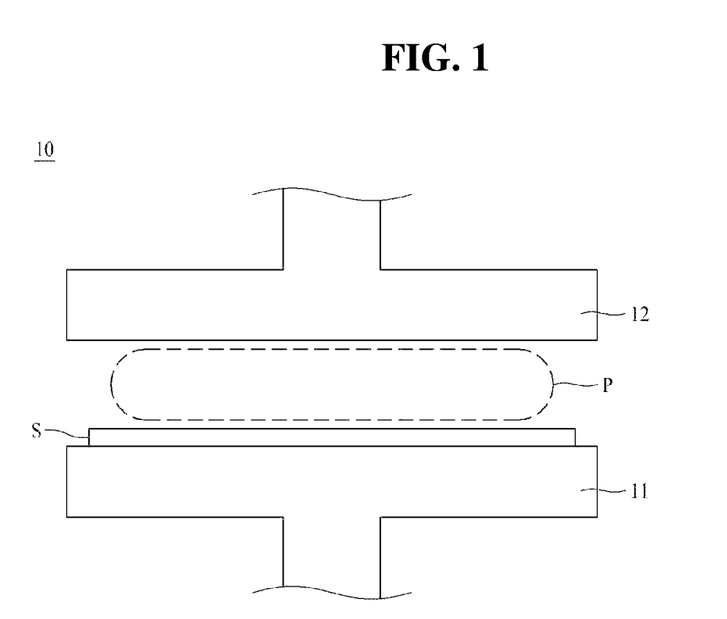
FIG. 1 is a conceptual side view of a substrate processing apparatus according to the related art.

FIG. 1 is a conceptual side view of a substrate processing apparatus according to the related art.

Referring to FIG. 1, a substrate processing apparatus 10 according to the related art includes a supporting part 11 which supports a substrate S and an electrode member 12 which is disposed on the supporting part 11. The supporting part 11 is connected to be grounded. The electrode member 12 is connected to a plasma power source (not shown). When power is applied to the electrode member 12, plasma P is generated between the electrode member 12 and the supporting part 11.

Therefore, in the substrate processing apparatus 10 according to the related art, the plasma P is generated between the substrate S supported by the supporting part 11 and the electrode member 12, and due to this, there is a problem where a risk of damage of the substrate S caused by the plasma P is high.

DISCLOSURE

Technical Problem

The present inventive concept is devised to solve the above-described problem and is for providing a substrate processing apparatus for decreasing a risk of damage of a substrate caused by plasma.

Technical Solution

To accomplish the above-described objects, the present inventive concept may include below-described elements.

A substrate processing apparatus according to the present inventive concept may include: a supporting part supporting a substrate; a first electrode unit disposed on the supporting part; a second electrode unit disposed on the first electrode unit; a generating hole provided to pass through the first electrode unit; and a protrusion electrode coupled to the second electrode unit to protrude from the second electrode unit to a lower portion at a position corresponding to the generating hole. The protrusion electrode may be provided to have a length which is shorter than the first electrode unit with respect to a vertical direction.

Advantageous Effect

According to the present inventive concept, the following effects can be obtained.

Since the present inventive concept is implemented to increase a distance between a substrate and plasma spaced apart from each other, a risk of damage of the substrate caused by plasma may be reduced, and moreover, a yield rate and quality of the substrate on which a processing process ends may be enhanced.

DETAILED DESCRIPTION

Hereinafter, an embodiment of a substrate processing apparatus according to the present inventive concept will be described in detail with reference to the accompanying drawings.

Figure 2:
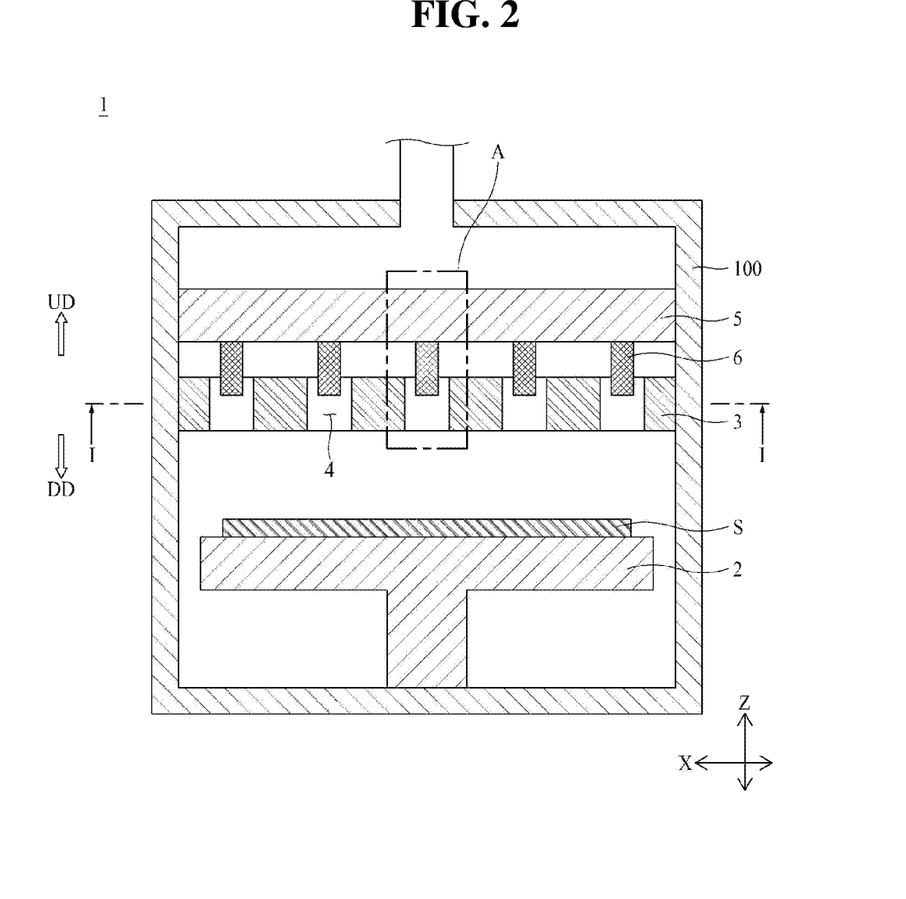
FIG. 2 is a schematic side cross-sectional view of a substrate processing apparatus according to the present inventive concept.
Figure 3:
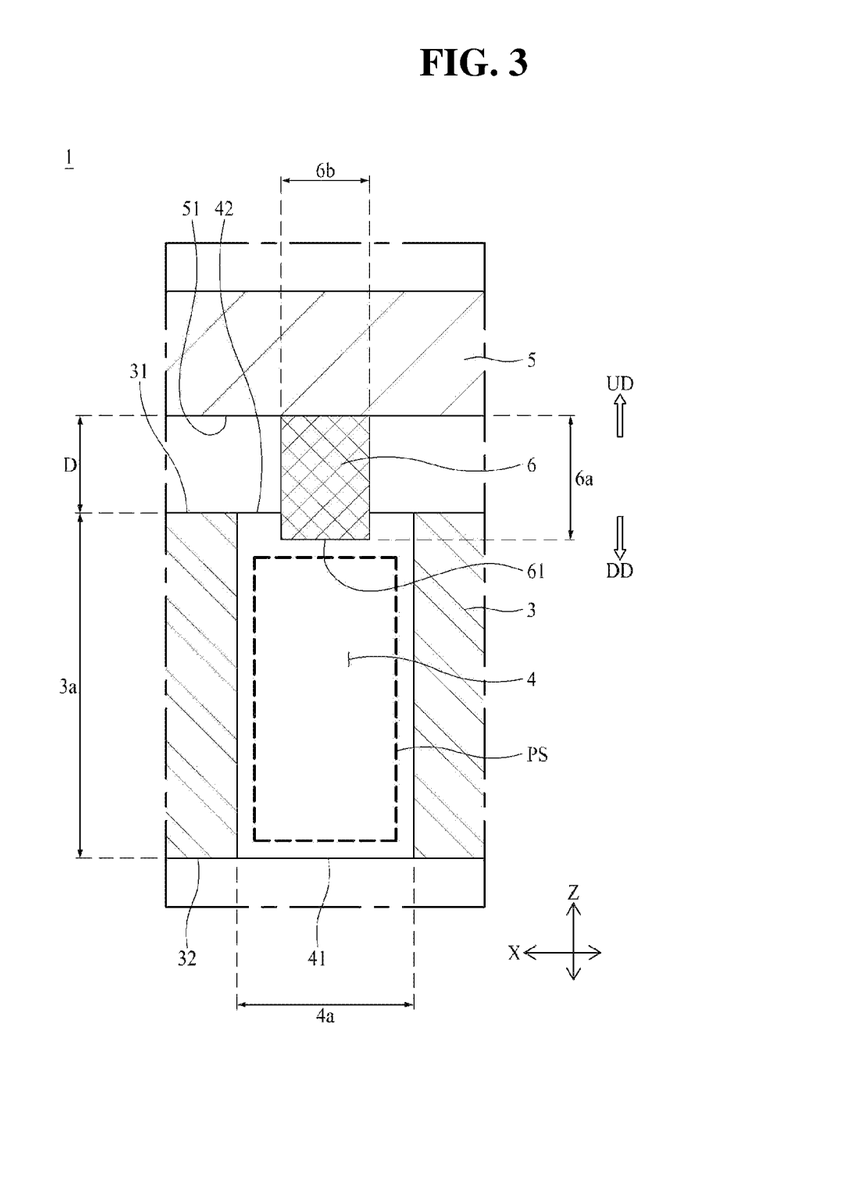
FIG. 3 is a side cross-sectional view illustrating an enlarged portion A of FIG. 2.

Referring to FIGS. 2 and 3, a substrate processing apparatus 1 according to the present inventive concept performs a processing process on a substrate S. For example, the substrate processing apparatus 1 according to the present inventive concept may perform at least one of a deposition process of depositing a thin film on the substrate S and an etching process of removing a portion of the thin film deposited on the substrate S. The substrate processing apparatus 1 according to the present inventive concept includes a supporting part 2, a first electrode unit 3, a generating hole 4, a second electrode unit 5, and a protrusion electrode 6.

Referring to FIG. 2, the supporting part 2 supports the substrate S. The supporting part 2 may be disposed under the first electrode unit 3. In this case, the substrate S may be disposed on an upper surface of the supporting part 2. Therefore, the substrate S may be supported by the supporting part 2 so as to be disposed between the supporting part 2 and the first electrode unit 3 with respect to a vertical direction (a Z-axis direction). The substrate S may be a semiconductor substrate, a wafer, or the like. The supporting part 2 may support a plurality of substrates S. The supporting part 2 may be coupled to a chamber 100 which provides a processing space where the processing process is performed. The supporting part 2 may be disposed in the chamber 100. The supporting part 2 may be rotatably coupled to the chamber 100. In this case, the supporting part 2 may be connected to a rotation unit which provides a rotational force. The rotation unit may rotate the supporting part 2 to rotate the substrate S supported by the supporting part 2.

Referring to FIGS. 2 and 3, the first electrode unit 3 is for generating plasma. The first electrode unit 3 may be disposed on the supporting part 2. The first electrode unit 3 may be disposed apart from the supporting part 2 by a certain distance in an upward direction (a UD arrow direction). The first electrode unit 3 may be coupled to the chamber 100 so as to be disposed in the chamber 100. The first electrode unit 3 may be wholly provided in a tetragonal plate shape, but is not limited thereto and may be provided in another shape such as a disc shape for generating plasma.

Referring to FIGS. 2 and 3, the generating hole 4 is provided to pass through the first electrode unit 3. The generating hole 4 may be provided to pass through an upper surface 31 of the first electrode unit 3 and a lower surface of the first electrode unit 3. The generating hole 4 may be wholly provided in a cylindrical shape, but is not limited thereto and may be provided in another shape. The generating hole 4 may be provided in plurality in the first electrode unit 3. In this case, the generating holes 4 may be disposed at positions spaced apart from one another.

Referring to FIGS. 2 and 3, the second electrode unit 5 is for generating plasma. The second electrode unit 5 may be disposed on the first electrode unit 3. The second electrode unit 5 may be disposed apart from the first electrode unit 3 by a certain distance in an upward direction (the UD arrow direction). The second electrode unit 5 may be coupled to the chamber 100 so as to be disposed in the chamber 100. The second electrode unit 5 may be wholly provided in a tetragonal plate shape, but is not limited thereto and may be provided in another shape such as a disc shape for generating plasma. When the second electrode unit 5 is disposed on the first electrode unit 3, the first electrode unit 3 may be disposed so that an upper surface 31 thereof faces the second electrode unit 5 and a lower surface 32 thereof faces the supporting part 2 faces the supporting part 2. In this case, the second electrode unit 5 may be disposed so that a lower surface 51 thereof faces the upper surface 31 of the first electrode unit 3. The lower surface 51 of the second electrode unit 5 and the upper surface 31 of the first electrode unit 3 are spaced apart from each other by a certain distance with respect to the vertical direction (the Z-axis direction). An insulation member (not shown) for insulation may be disposed on the lower surface 51 of the second electrode unit 5 and the upper surface 31 of the first electrode unit 3.

Referring to FIG. 3, the protrusion electrode 6 is for generating plasma. The protrusion electrode 6 may be coupled to the second electrode unit 5. The protrusion electrode 6 may protrude from the second electrode unit 5 in a downward direction (a DD arrow direction). In this case, the protrusion electrode 6 may protrude from a portion, disposed on the generating hole 4, of the lower surface 51 of the second electrode 5. That is, the protrusion electrode 6 may be disposed at a position corresponding to the generating hole 4.

The protrusion electrode 6 may be grounded through the second electrode unit 5. In this case, the first electrode unit 3 may be connected to a plasma power source (not shown) which supplies power. When the plasma power source applies the power to the first electrode unit 3, plasma may be generated from an electric field generated between the protrusion electrode 6 and the first electrode unit 3. The protrusion electrode 6 may be coupled to the second electrode unit 5 so as to be electrically connected to the second electrode unit 5. The protrusion electrode 6 and the second electrode unit 5 may be provided as one body. Although not shown, the protrusion electrode 6 and the second electrode unit 5 may be connected to the plasma power source, and the first electrode unit 3 may be grounded.

The protrusion electrode 6 may be provided to have a length 6a which is shorter than that of the first electrode unit 3 with respect to the vertical direction (the Z-axis direction). A length 3a of the first electrode unit 3 denotes a length of a portion, where the generating hole 4 is provided, of the first electrode unit 3 with respect to the vertical direction (the Z-axis direction). In this case, the length 6a of the protrusion electrode 6 is shorter than the length 3a of the first electrode unit 3 with respect to the vertical direction (the Z-axis direction). Therefore, the substrate processing apparatus 1 according to the present inventive concept may be implemented so that a plasma generating space PS which is empty is secured between a lower end 41 of the generating hole 4 and the protrusion electrode 6, and thus, plasma is generated in the first electrode unit 3 through the generating hole 4. This will be described below in detail.

Figure 4:
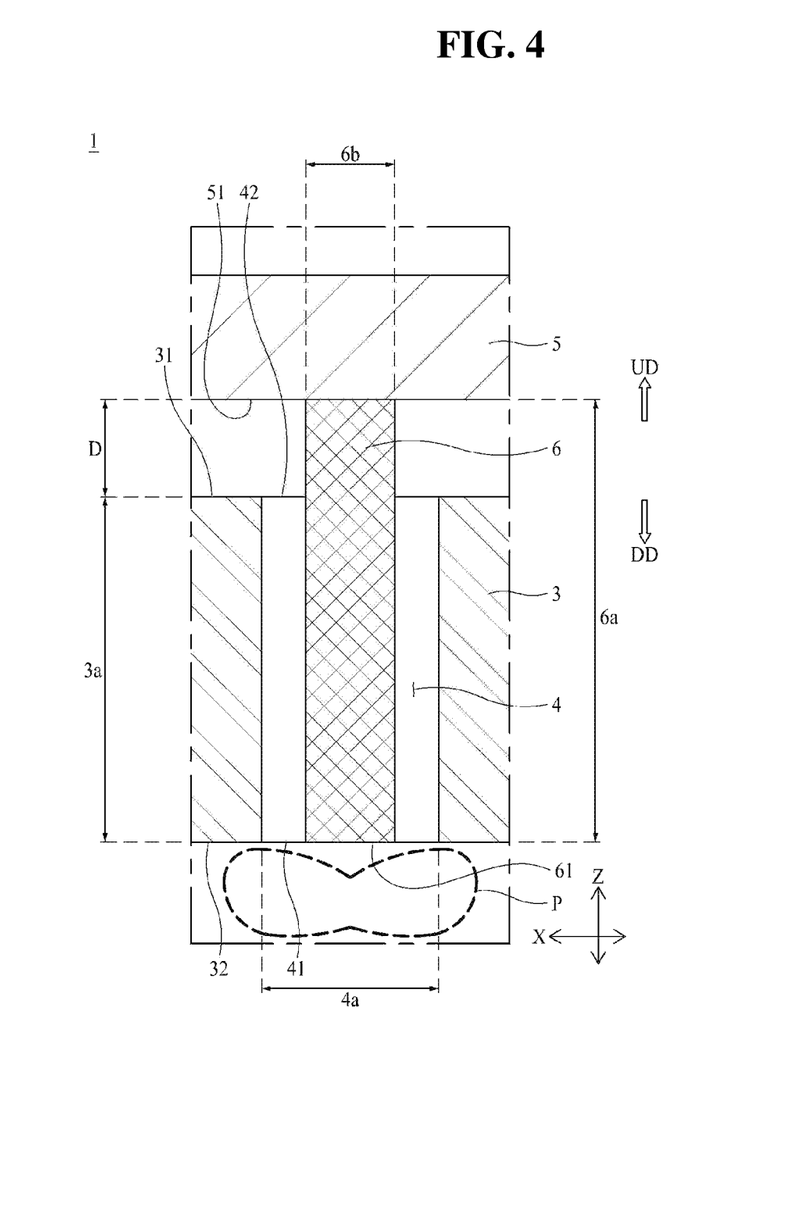
FIG. 4 is a schematic side cross-sectional view of a first comparative example of a substrate processing apparatus according to the present inventive concept.

First, in a first comparative example where the length 6a of the protrusion electrode 6 is implemented to be shorter than the length 3a of the first electrode unit 3 with respect to the vertical direction (the Z-axis direction) as illustrated in FIG. 4, the protrusion electrode 6 may be implemented to be disposed in a whole inner portion of the first electrode unit 3. Although not shown, the protrusion electrode 6 may protrude from the lower surface 32 of the first electrode unit 3 in the downward direction (the DD arrow direction), in addition to that the protrusion electrode 6 is disposed in the whole inner portion of the first electrode unit 3. Therefore, a space where plasma is to be generated through the generating hole 4 is insufficient in the inner portion of the first electrode unit 3, and thus, plasma P is generated outside the first electrode unit 3. Accordingly, in the first comparative example, the plasma P is generated between the lower surface 32 of the first electrode unit 3 and the supporting part 2 (illustrated in FIG. 2) with respect to the vertical direction (the Z-axis direction), and due to this, a risk of damage of the substrate S (illustrated in FIG. 2) is high due to the plasma P.

Next, in an embodiment where the length 6a of the protrusion electrode 6 is implemented to be shorter than the length 3a of the first electrode unit 3 with respect to the vertical direction (the Z-axis direction) as illustrated in FIG. 3, the protrusion electrode 6 may be implemented to be disposed in a portion of the inner portion of the first electrode unit 3. Therefore, in an embodiment, the plasma generating space PS is secured between the lower end 41 of the generating hole 4 and the protrusion electrode 6, and thus, plasma is generated in the first electrode unit 3 through the plasma generating space PS.

Therefore, the substrate processing apparatus 1 according to the present inventive concept may increase a distance by which plasma is spaced apart from the substrate S supported by the supporting part 2, thereby decreasing a risk of damage of the substrate S caused by the plasma. Accordingly, the substrate processing apparatus 1 according to the present inventive concept may enhance a yield rate and quality of a substrate on which the processing process ends. Also, when the deposition process is performed, the substrate processing apparatus 1 according to the present inventive concept may enhance the film quality of a thin film deposited on the substrate S.

Figure 5:
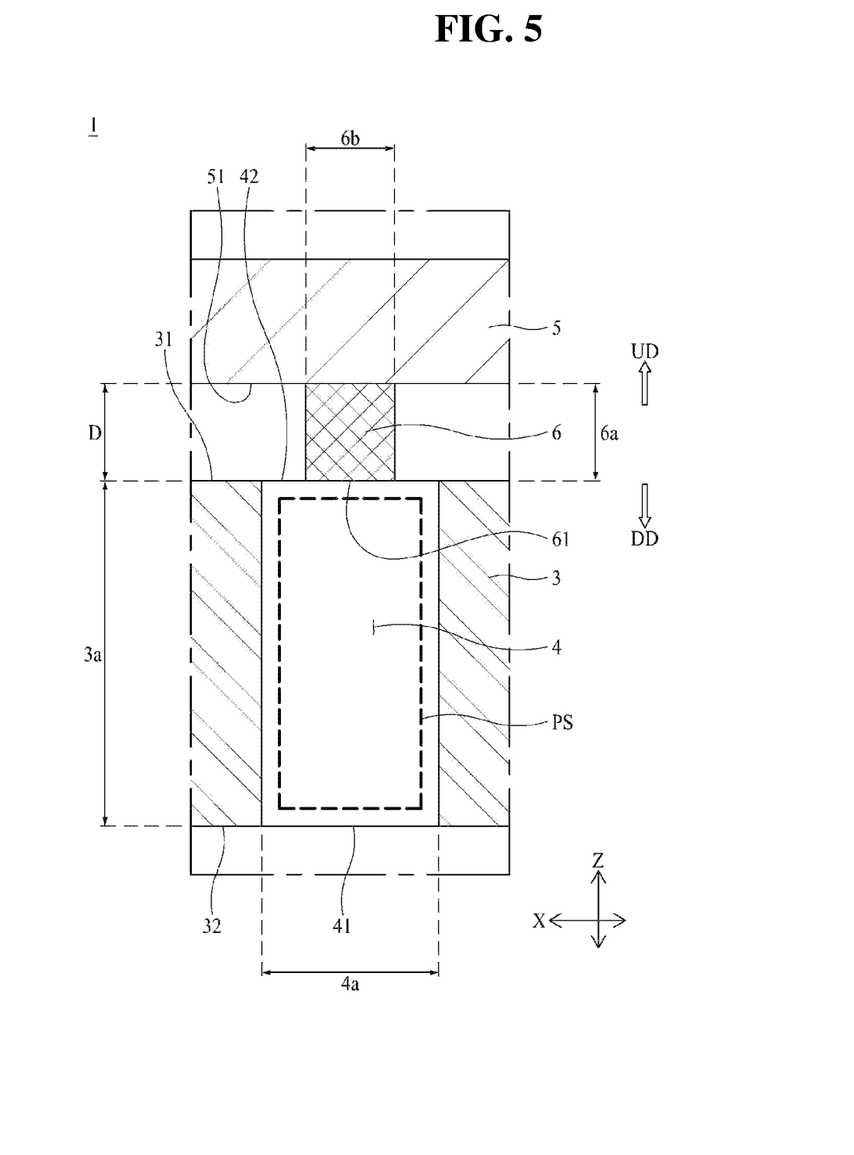
FIG. 5 is a side cross-sectional view illustrating an enlarged portion of an embodiment of a substrate processing apparatus according to the present inventive concept with respect to the portion A of FIG. 2.

Referring to FIGS. 3 and 5, the protrusion electrode 6 may protrude from the lower surface 51 of the second electrode unit 5. In this case, the protrusion electrode 6 may protrude by a length 6a which is equal to or longer than an interval D between the first electrode unit 3 and the second electrode unit 5 spaced apart from each other with respect to the vertical direction (the Z-axis direction). Even when the protrusion electrode 6 protrudes by the length 6a which is longer than the interval D, the protrusion electrode 6 may be provided to have the length 6a which is shorter than that of the first electrode unit 3 with respect to the vertical direction (the Z-axis direction). Accordingly, the substrate processing apparatus 1 according to the present inventive concept may be implemented so that the plasma generating space PS under the protrusion electrode 6 is secured in the generating hole 4, and thus, plasma is generated in the first electrode unit 3.

The protrusion electrode 6 may include an opposite surface 61. The opposite surface 61 is a surface which is disposed in a lowermost end to face the supporting part 2 (illustrated in FIG. 2) from the protrusion electrode 6. The opposite surface 61 may correspond to a lower surface of the protrusion electrode 6.

As illustrated in FIG. 5, the opposite surface 61 may be disposed at the same height as the upper surface 31 of the first electrode unit 3 with respect to the vertical direction (the Z-axis direction). Therefore, the opposite surface 61 may be disposed at the same height as an upper end 42 of the generating hole 4 with respect to the vertical direction (the Z-axis direction). In this case, the protrusion electrode 6 may protrude by the same length 6a as the interval D between the first electrode unit 3 and the second electrode unit 5 spaced apart from each other with respect to the vertical direction (the Z-axis direction). Accordingly, the substrate processing apparatus 1 according to the present inventive concept may be implemented so that a whole portion of the generating hole 4 is used as the plasma generating space PS, and thus, a size of a space for generating plasma in the first electrode unit 3 is maximized.

As illustrated in FIG. 3, the protrusion electrode 6 may be disposed to be inserted into the first electrode unit 3. In this case, the protrusion electrode 6 may be inserted into the generating hole 4. Therefore, the opposite surface 61 may be disposed inside the first electrode unit 3. In this case, the opposite surface 61 may be disposed between the upper surface 31 of the first electrode unit 3 and the lower surface 32 of the first electrode unit 3 with respect to the vertical direction (the Z-axis direction). That is, the opposite surface 61 may be disposed between the upper end 42 of the generating hole 4 and the lower end 41 of the generating hole 4 with respect to the vertical direction (the Z-axis direction). Therefore, the substrate processing apparatus 1 according to the present inventive concept may be implemented so that an electrode is disposed inside the first electrode unit 3 by using the protrusion electrode 6 inserted into the generating hole 4, and moreover, may be implemented so that the plasma generating space PS is disposed inside the first electrode unit 3 through the generating hole 4. When the protrusion electrode 6 is grounded, the substrate processing apparatus 1 according to the present inventive concept may increase performance of a ground electrode disposed inside the first electrode unit 3 to reinforce plasma generated in the plasma generating space PS, and simultaneously, may allow plasma to be generated inside the first electrode unit 3, thereby reducing a risk of damage of the substrate S caused by the plasma.

The protrusion electrode 6 may be provided to have a diameter 6b which is less than that of the generating hole 4 with respect to a horizontal direction (an X-axis direction) vertical to the vertical direction (the Z-axis direction). In this case, the diameter 6b of the protrusion electrode 6 is less than a diameter 4a of the generating hole 4 with respect to the horizontal direction (the X-axis direction). Therefore, the substrate processing apparatus 1 according to the present inventive concept may be implemented so that, even when the protrusion electrode 6 is inserted into the generating hole 4, the protrusion electrode 6 does not contact the first electrode unit 3.

Figure 6:
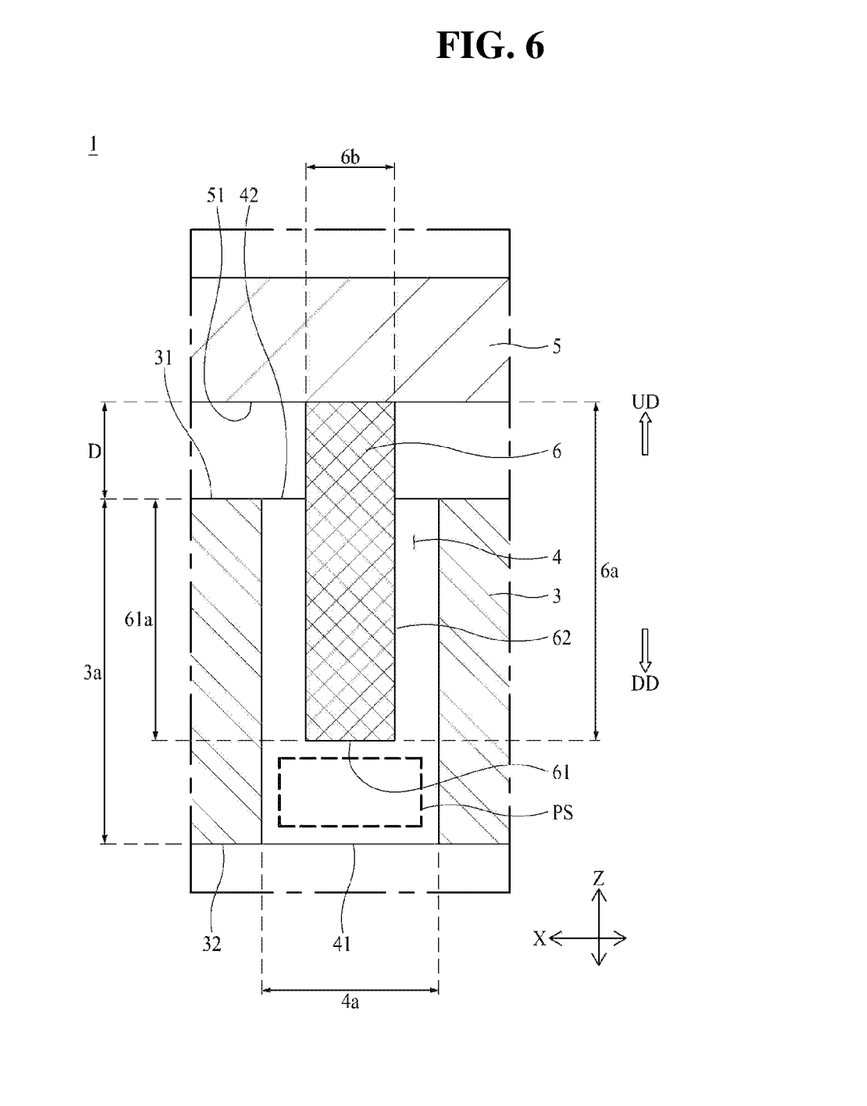
FIG. 6 is a side cross-sectional view illustrating an enlarged portion of a modified embodiment of a substrate processing apparatus according to the present inventive concept with respect to the portion A of FIG. 2.
Figure 7:
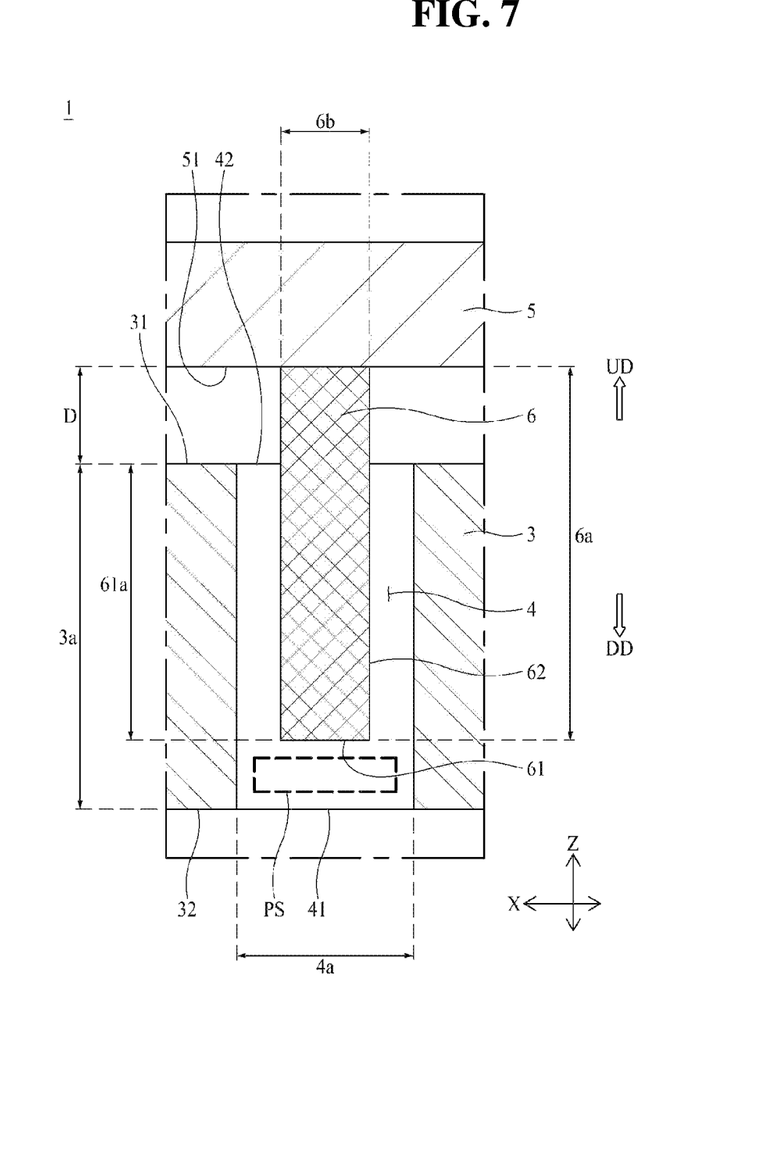
FIG. 7 is a schematic side cross-sectional view of a second comparative example of a substrate processing apparatus according to the present inventive concept.

Referring to FIGS. 6 and 7, when the first electrode unit 3 is provided to have the length 3a "L" (where L is a real number greater than zero) with respect to the vertical direction (the Z-axis direction), a length 61a obtained by subtracting the interval D between the first electrode unit 3 and the second electrode unit 5 from the total length 6a of the protrusion electrode 6 may be equal to or less than 0.7 L with respect to the vertical direction (the Z-axis direction). That is, the length 61a of a portion, inserted into the first electrode unit 3, of the protrusion electrode 6 may be equal to or less than 0.7 L. Therefore, the substrate processing apparatus 1 according to the present inventive concept may decrease the number of electrons and ions between a side surface 62 of the protrusion electrode 6 and the first electrode unit 3 and may increase the number of electrons and ions between the opposite surface 61 of the protrusion electrode 6 and the lower end 41 of the generating hole 4. This will be described below in detail.

First, in a second comparative example where the length 61a of a portion, inserted into the first electrode unit 3, of the protrusion electrode 6 is provided to be longer than 0.7 L with respect to the vertical direction (the Z-axis direction) as illustrated in FIG. 7, the plasma generating space PS disposed between the opposite surface 61 of the protrusion electrode 6 and the lower end 41 of the generating hole 4 is provided to have a length of less than 0.3 L with respect to the vertical direction (the Z-axis direction). Therefore, the number of electrons and ions capable of being accommodated into the plasma generating space PS decreases by a size decrement of the plasma generating space PS, and thus, the number of electrons and ions moving to a space between the side surface 62 of the protrusion electrode 6 and the first electrode unit 3 increases. Accordingly, in the second comparative example, loss occurs in electrons and ions for generating plasma, and due to this, plasma generated in the plasma generating space PS may be weakened. Also, the second comparative example should increase a level of power supplied by the plasma power source, for preventing the plasma generated in the plasma generating space PS from being weakened.

Next, in an embodiment where the length 61a of a portion, inserted into the first electrode unit 3, of the protrusion electrode 6 is provided to have a length of 0.7 L with respect to the vertical direction (the Z-axis direction) as illustrated in FIG. 6, the plasma generating space PS disposed between the opposite surface 61 and the lower end 41 of the generating hole 4 is provided to have a length of 0.3 L with respect to the vertical direction (the Z-axis direction). Therefore, comparing with the second comparative example, in an embodiment, the number of electrons and ions capable of being accommodated into the plasma generating space PS may increase by a size increment of the plasma generating space PS, and thus, the number of electrons and ions moving to a space between the side surface 62 of the protrusion electrode 6 and the first electrode unit 3 may decrease. Accordingly, in an embodiment, loss occurring in electrons and ions for generating plasma may be reduced, thereby reinforcing plasma generated in the plasma generating space PS. Also, in an embodiment, a level of power which should be supplied by the plasma power source for generating plasma in the plasma generating space PS may be reduced, and thus, plasma may be stably generated despite a low power value.

Moreover, in an embodiment where the length 61*a* of a portion, inserted into the first electrode unit 3, of the protrusion electrode 6 is provided to have a length of 0.7 L with respect to the vertical direction (the Z-axis direction), the plasma generating space PS disposed between the opposite surface 61 and the lower end 41 of the generating hole 4 is provided to have a length of more than 0.3 L with respect to the vertical direction (the Z-axis direction). Therefore, the substrate processing apparatus 1 according to the present inventive concept may more increase, by a size increment of the plasma generating space PS, the number of electrons and ions capable of being accommodated into the plasma generating space PS.

Therefore, the substrate processing apparatus 1 according to the present inventive concept may be implemented so that the length 61*a* of a portion, inserted into the first electrode unit 3, of the protrusion electrode 6 is provided to have a length of 0.7 L or less with respect to the vertical direction (the Z-axis direction), plasma efficiency may increase, and moreover, plasma may be stably generated under more various conditions. Even in this case, the total length 6*a* of the protrusion electrode 6 may be equal to or longer than an interval D between the upper surface 31 of the first electrode unit 3 and the lower surface 51 of the second electrode unit 5 spaced apart from each other.

Preferably, the length 61*a* obtained by subtracting the interval D between the first electrode unit 3 and the second electrode unit 5 from the total length 6*a* of the protrusion electrode 6 may be 0.5 L with respect to the vertical direction (the Z-axis direction). In this case, the plasma generating space PS disposed between the opposite surface 61 and the lower end 41 of the generating hole 4 is provided to have a length of 0.5 L with respect to the vertical direction (the Z-axis direction). Therefore, the substrate processing apparatus 1 according to the present inventive concept may more increase, by a size increment of the plasma generating space PS, the number of electrons and ions capable of being accommodated into the plasma generating space PS, and thus, may more decrease the number of electrons and ions moving to a space between the side surface 62 of the protrusion electrode 6 and the first electrode unit 3. Accordingly, the substrate processing apparatus 1 according to the present inventive concept may more reduce loss which occurs in electrons and ions for generating plasma, thereby more reinforcing plasma generated in the plasma generating space PS. Also, in the substrate processing apparatus 1 according to the present inventive concept, a level of power which should be supplied by the plasma power source for generating plasma in the plasma generating space PS may be more reduced, and thus, plasma may be more stably generated despite a low power value.

Here, the opposite surface 61 may be disposed at a position which is spaced apart from the upper surface 31 of the first electrode unit 3 by a distance of 0.7 L with respect to the vertical direction (the Z-axis direction). In this case, with respect to the vertical direction (the Z-axis direction), the protrusion electrode 6 may be provided to have the length 6*a* obtained by adding 0.7 L to the interval D between the upper surface 31 of the first electrode unit 3 and the lower surface 51 of the second electrode unit 5 spaced apart from each other. Therefore, the substrate processing apparatus 1 according to the present inventive concept may decrease the number of electrons and ions between the side surface 62 of the protrusion electrode 6 and the first electrode unit 3 and may increase the number of electrons and ions between the opposite surface 61 and the lower end 41 of the generating hole 4. This will be described below in detail.

First, in a third comparative example where the opposite surface 61 is disposed at a position which is spaced apart from the upper surface 31 of the first electrode unit 3 by a distance of more than 0.7 L with respect to the vertical direction (the Z-axis direction), the plasma generating space PS disposed between the opposite surface 61 of the protrusion electrode 6 and the lower end 41 of the generating hole 4 is provided to have a length of less than 0.3 L with respect to the vertical direction (the Z-axis direction). Therefore, the number of electrons and ions capable of being accommodated into the plasma generating space PS decreases by a size decrement of the plasma generating space PS, and thus, the number of electrons and ions moving to a space between the side surface 62 of the protrusion electrode 6 and the first electrode unit 3 increases. Accordingly, in the third comparative example, loss occurs in electrons and ions for generating plasma, and due to this, plasma generated in the plasma generating space PS may be weakened. Also, the third comparative example should increase a level of power supplied by the plasma power source, for preventing the plasma generated in the plasma generating space PS from being weakened.

Next, in an embodiment where the opposite surface 61 is disposed at a position which is spaced apart from the upper surface 31 of the first electrode unit 3 by a distance of 0.7 L with respect to the vertical direction (the Z-axis direction), the plasma generating space PS disposed between the opposite surface 61 and the lower end 41 of the generating hole 4 is provided to have a length of 0.3 L with respect to the vertical direction (the Z-axis direction). Therefore, comparing with the third comparative example, in an embodiment, the number of electrons and ions capable of being accommodated into the plasma generating space PS may increase by a size increment of the plasma generating space PS, and thus, the number of electrons and ions moving to a space between the side surface 62 of the protrusion electrode 6 and the first electrode unit 3 may decrease. Accordingly, in an embodiment, loss occurring in electrons and ions for generating plasma may be reduced, thereby reinforcing plasma generated in the plasma generating space PS. Also, in an embodiment, a level of power which should be supplied by the plasma power source for generating plasma in the plasma generating space PS may be reduced, and thus, plasma may be stably generated despite a low power value.

Therefore, the substrate processing apparatus 1 according to the present inventive concept may be implemented so that the opposite surface 61 is disposed at a position which is spaced apart from the upper surface 31 of the first electrode unit 3 by a distance of 0.7 L with respect to the vertical direction (the Z-axis direction), plasma efficiency may increase, and moreover, plasma may be stably generated under more various conditions.

Here, the opposite surface 61 may be disposed at a position which is spaced apart from the upper surface 31 of the first electrode unit 3 by a length of 0.7 L with respect to the vertical direction (the Z-axis direction), In this case, with respect to the vertical direction (the Z-axis direction), the protrusion electrode 6 may be provided to have the length 6a obtained by adding 0.7 L to the interval D between the upper surface 31 of the first electrode unit 3 and the lower surface 51 of the second electrode unit 5 spaced apart from each other. Therefore, the substrate processing apparatus 1 according to the present inventive concept may decrease the number of electrons and ions between the side surface 62 of the protrusion electrode 6 and the first electrode unit 3 and may increase the number of electrons and ions between the opposite surface 61 and the lower end 41 of the generating hole 4. This will be described below in detail.

First, in the third comparative example where the opposite surface 61 is disposed at a position which is spaced apart from the upper surface 31 of the first electrode unit 3 by a distance of more than 0.7 L with respect to the vertical direction (the Z-axis direction), the plasma generating space PS disposed between the opposite surface 61 and the lower end 41 of the generating hole 4 is provided to have a length of less than 0.3 L with respect to the vertical direction (the Z-axis direction). Therefore, the number of electrons and ions capable of being accommodated into the plasma generating space PS decreases by a size decrement of the plasma generating space PS, and thus, the number of electrons and ions moving to a space between the side surface 62 of the protrusion electrode 6 and the first electrode unit 3 increases. Accordingly, in the third comparative example, loss occurs in electrons and ions for generating plasma, and due to this, plasma generated in the plasma generating space PS may be weakened. Also, the third comparative example should increase a level of power supplied by the plasma power source, for preventing the plasma generated in the plasma generating space PS from being weakened.

Next, in an embodiment where the opposite surface 61 is disposed at a position which is spaced apart from the upper surface 31 of the first electrode unit 3 by a distance of 0.7 L with respect to the vertical direction (the Z-axis direction), the plasma generating space PS disposed between the opposite surface 61 and the lower end 41 of the generating hole 4 is provided to have a length of 0.3 L with respect to the vertical direction (the Z-axis direction). Therefore, comparing with the third comparative example, in an embodiment, the number of electrons and ions capable of being accommodated into the plasma generating space PS may increase by a size increment of the plasma generating space PS, and thus, the number of electrons and ions moving to a space between the side surface 62 of the protrusion electrode 6 and the first electrode unit 3 may decrease. Accordingly, in an embodiment, loss occurring in electrons and ions for generating plasma may be reduced, thereby reinforcing plasma generated in the plasma generating space PS. Also, in an embodiment, a level of power which should be supplied by the plasma power source for generating plasma in the plasma generating space PS may be reduced, and thus, plasma may be stably generated despite a low power value.

Therefore, the substrate processing apparatus 1 according to the present inventive concept may be implemented so that the opposite surface 61 is disposed at a position which is spaced apart from the upper surface 31 of the first electrode unit 3 by a distance of 0.7 L with respect to the vertical direction (the Z-axis direction), plasma efficiency may increase, and moreover, plasma may be stably generated under more various conditions.

Preferably, the opposite surface 61 may be disposed at a position which is spaced apart from the upper surface 31 of the first electrode unit 3 by a length of 0.5 L with respect to the vertical direction (the Z-axis direction), In this case, with respect to the vertical direction (the Z-axis direction), the protrusion electrode 6 may be provided to have a length 6a obtained by adding 0.5 L to the interval D between the upper surface 31 of the first electrode unit 3 and the lower surface 51 of the second electrode unit 5 spaced apart from each other. Therefore, the substrate processing apparatus 1 according to the present inventive concept may decrease the number of electrons and ions between the side surface 62 of the protrusion electrode 6 and the first electrode unit 3 and may increase the number of electrons and ions between the opposite surface 61 and the lower end 41 of the generating hole 4. Accordingly, the substrate processing apparatus 1 according to the present inventive concept may increase plasma efficiency, and moreover, may stably generate plasma under more various conditions.

The opposite surface 61 may also be disposed at a position which is spaced apart from the upper surface 31 of the first electrode unit 3 by a distance of less than 0.7 L with respect to the vertical direction (the Z-axis direction), In this case, the plasma generating space PS disposed between the opposite surface 61 and the lower end 41 of the generating hole 4 may be provided to have a length of more than 0.3 L with respect to the vertical direction (the Z-axis direction). Therefore, the substrate processing apparatus 1 according to the present inventive concept may more increase, by a size increment of the plasma generating space PS, the number of electrons and ions capable of being accommodated into the plasma generating space PS.

When the opposite surface 61 is disposed higher in position than the upper surface 31 of the first electrode unit 3 with respect to the vertical direction (the Z-axis direction), the protrusion electrode 6 is not inserted into the generating hole 4, and thus, is disposed outside the first electrode unit 3. Therefore, an electrode using the protrusion electrode 6 is not disposed inside the first electrode unit 3, plasma efficiency may be reduced. In order to prevent this, the opposite surface 61 may be disposed at the same height as the upper surface 31 of the first electrode unit 3 or may be disposed to be lower in position than the upper surface 31 of the first electrode unit 3 with respect to the vertical direction (the Z-axis direction).

Figure 8:
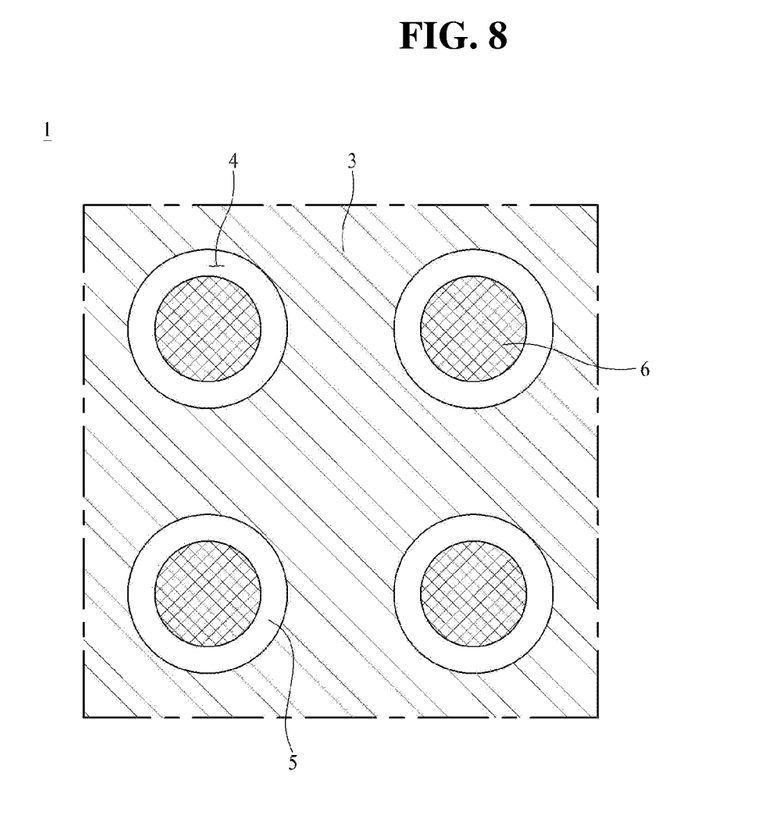
FIG. 8 is a schematic cross-sectional view illustrating a first electrode unit, a second electrode unit, and a protrusion electrode with respect to line I-I of FIG. 2 in a substrate processing apparatus according to the present inventive concept.

Referring to FIG. 8, the protrusion electrode 6 may be provided in plurality, and the plurality of protrusion electrodes 6 may be coupled to the second electrode unit 5. In this case, the protrusion electrodes 6 may be disposed at positions spaced apart from one another. When the generating hole 4 is provided in plurality in the first electrode unit 3, the protrusion electrodes 6 may be disposed at positions respectively corresponding to the generating holes 4. Accordingly, the substrate processing apparatus 1 according to the present inventive concept may be implemented so that an individual electrode using the protrusion electrode 6 is disposed in each of the generating holes 4.

Figure 9:
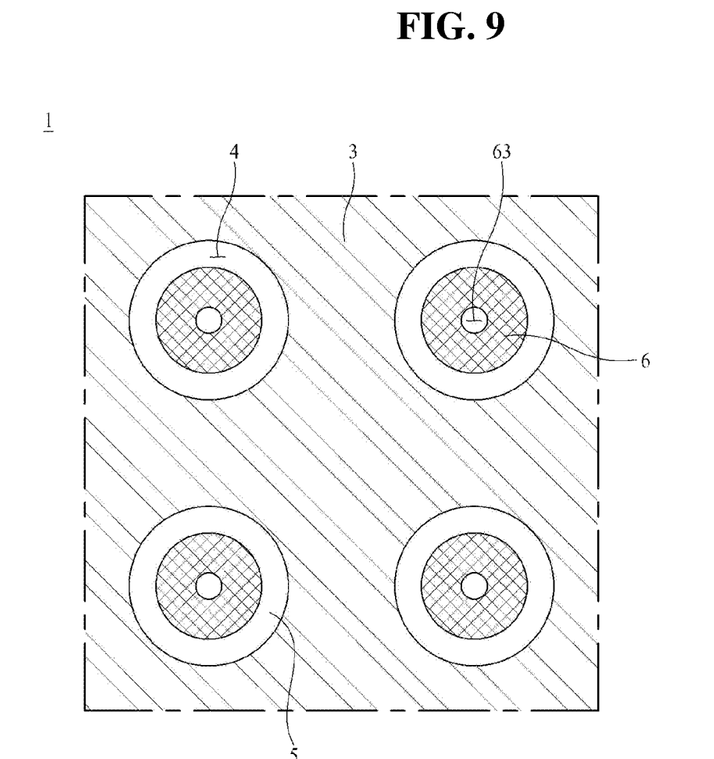
FIG. 9 is a schematic cross-sectional view illustrating an embodiment, where a protrusion electrode includes a distribution hole, with respect to line I-I of FIG. 2 in a substrate processing apparatus according to the present inventive concept.

Referring to FIG. 9, the protrusion electrode 6 may include a distribution hole 63.

The distribution hole 63 is for distributing a process gas to the generating hole 4. The distribution hole 63 may be provided to pass through the protrusion electrode 6. A lower end of the distribution hole 63 may be disposed to communicate with the generating hole 4. An upper end of the distribution hole 63 may be disposed to be connected to a gas storage unit (not shown). The gas storage unit stores the process gas. The process gas is used to perform the processing process, and for example, may include a gas such as a titanium family element (titanium (Ti), zirconium (Zr), hafnium (Hf), or the like) or aluminum (Al). In this case, a process gas including silicon (Si) may be silane ($SiH_4$), disilane (Si$_2$H$_6$), trisilane (Si$_3$H$_8$), tetraethylorthosilicate (TEOS), dichlorosilane (DCS), hexachlorosilane (HCD), tri-dimethylaminosilane (TriDMAS), and trisilylamine (TSA).

The distribution hole 63 may be provided to pass through the protrusion electrode 6 and the second electrode unit 5. In this case, a gas supply unit may be coupled to the second electrode unit 5 so as to be connected to the distribution hole 63.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:

1. A substrate processing apparatus comprising:
   a supporting part operable to support a substrate;
   a first electrode unit disposed above the supporting part;
   a second electrode unit disposed above the first electrode unit;
   a generating hole provided to pass through the first electrode unit; and
   a protrusion electrode coupled to the second electrode unit to protrude from the second electrode unit to a lower portion at a position corresponding to the generating hole,
   wherein the protrusion electrode is provided to have a length which is shorter than the first electrode unit with respect to a vertical direction, and
   wherein the first electrode unit is provided to have a length L with respect to the vertical direction, where L is a real number greater than zero, and
   wherein a length obtained by subtracting an interval between the first electrode unit and the second electrode unit from a total length of the protrusion electrode is 0.5 L with respect to the vertical direction.

2. The substrate processing apparatus of claim 1, wherein the protrusion electrode comprises an opposite surface disposed at a lowermost end to face the supporting part, and the opposite surface is inserted into the generating hole so as to be disposed inside the first electrode.

3. The substrate processing apparatus of claim 1, wherein
   the protrusion electrode comprises an opposite surface disposed at a lowermost end to face the supporting part, and
   the opposite surface is disposed at a position which is spaced apart from an upper surface of the first electrode unit by a distance of 0.5 L with respect to the vertical direction.

4. The substrate processing apparatus of claim 1, wherein the protrusion electrode comprises a distribution hole for distributing a process gas to the generating hole.

5. The substrate processing apparatus of claim 1, wherein the protrusion electrode is provided to have a diameter which is less than the generating hole with respect to a horizontal direction vertical to the vertical direction.

6. The substrate processing apparatus of claim 1, wherein
   the first electrode unit is connected to a plasma power source which supplies power, and
   the second electrode unit and the protrusion electrode are grounded.

* * * * *